US012125658B2

(12) United States Patent
Burnsed et al.

(10) Patent No.: US 12,125,658 B2
(45) Date of Patent: Oct. 22, 2024

(54) SEMI-TRANSPARENT DETECTOR ARRAY FOR UV/NEAR-UV DETECTION

(71) Applicant: L3Harris Technologies, Inc., Melbourne, FL (US)

(72) Inventors: Jon D. Burnsed, Tempe, AZ (US); Jacob J. Becker, Gilbert, AZ (US)

(73) Assignee: L3Harris Technologies, Inc., Melbourne, FL (US)

( * ) Notice: Subject to any disclaimer, the term of this patent is extended or adjusted under 35 U.S.C. 154(b) by 403 days.

(21) Appl. No.: 17/514,884

(22) Filed: Oct. 29, 2021

(65) Prior Publication Data

US 2023/0139708 A1    May 4, 2023

(51) Int. Cl.
| | | |
|---|---|---|
| H10K 59/65 | (2023.01) | |
| G01J 3/44 | (2006.01) | |
| G02B 13/16 | (2006.01) | |
| G02B 23/12 | (2006.01) | |
| H01J 31/12 | (2006.01) | |
| H01J 31/50 | (2006.01) | |
| H10K 65/00 | (2023.01) | |
| G02B 27/01 | (2006.01) | |
| H10K 59/12 | (2023.01) | |

(52) U.S. Cl.
CPC ........... H01J 31/506 (2013.01); G01J 3/4406 (2013.01); G02B 13/16 (2013.01); G02B 23/12 (2013.01); H01J 31/12 (2013.01); H10K 59/65 (2023.02); H10K 65/00 (2023.02); *G02B 2027/0138* (2013.01); *H10K 59/12* (2023.02)

(58) Field of Classification Search
CPC ....... G01J 3/4406; G02B 13/16; G02B 23/12; G02B 2027/0138; H01J 31/12; H01J 31/506; H10K 59/12; H10K 59/65; H10K 65/00

See application file for complete search history.

(56) References Cited

U.S. PATENT DOCUMENTS

| | | |
|---|---|---|
| 8,830,204 B2 | 9/2014 | Sultenfuss et al. |
| 2020/0400944 A1 | 12/2020 | Burnsed et al. |

FOREIGN PATENT DOCUMENTS

WO    2007049213    5/2007

OTHER PUBLICATIONS

U.S. Appl. No. 16/868,306, filed May 6, 2020.
European Search Report received for EP Patent Application No. 22202248.5, mailed on Mar. 20, 2023, 8 pages.

*Primary Examiner* — Mark R Gaworecki
(74) *Attorney, Agent, or Firm* — Workman Nydegger (57) ABSTRACT

An apparatus and method are provided for a night vision system that integrates functions of detecting an intensified image and transmitting the intensified image superimposed with a heads-up display. The night vision system includes an optical device having a transparent display configured with pixels emitting display light (i.e., the heads-up display), and the transparent display has transmission regions arranged among the pixels for transmitting light representing an intensified image (e.g., luminescent light from a phosphor screen). Light rays passing through the transmission regions also pass through detectors, which detect light outside of the visible spectrum (e.g., UV light). By detecting light outside of the visible spectrum, the detectors detect the intensified image without degrading the image in the visible spectrum that is provided to users.

9 Claims, 10 Drawing Sheets

SEMI-TRANSPARENT DETECTOR ARRAY FOR UV/NEAR-UV DETECTION

BACKGROUND

Night vision (NV) systems allow users to see in low-light environments without flooding an environment with visible light. Accordingly, NV systems can be used for covert vision in low-light environments. By enabling sight without artificial illumination (e.g., the NV system providing light in the visible or other spectra), NV systems protect users from being detected.

Analog NV systems function by receiving low levels of light and providing that light to an image intensifier. The image intensifier has a photocathode that emits electrons in response to incident photons. The emitted electrons are accelerated through a vacuum tube and directed towards a microchannel plate that amplifies the signal by multiplying the number of electrons. The multiplied electrons then strike a phosphor screen, and, via the phenomenon of luminescence, the phosphor screen emits photons in response to radiant energy (e.g., the electrons). The phosphor screen is typically chosen such that it emits luminescent light in the visible spectrum (e.g., having wavelengths between 400 nm and 750 nm). The luminescent light from the phosphor screen is coupled through a series of optics to the user. For example, the luminescent light may be coupled through an inverting fiber optic to an eyepiece where the user can view the illuminated phosphor screen, thus allowing the user to see the objects.

In analog NV systems, it is desirable to implement a heads-up display in conjunction with the NV image. Such a display conveys to the user information, such as temperatures, distances, indicators marking objects, situational awareness messages, messages from other users, etc. In addition to combining the NV image and the heads-up display information as a single image, it is desirable to detect the NV image. For example, if the NV image were detected, the detected NV image could be recorded and/or shared with others providing support. Additionally, the detected NV image could be used to modify/apply corrections to the heads-up display information. Detecting the NV image, however, requires intercepting or otherwise diverting some of the light from the NV image, thereby attenuating the image provided to the user. Accordingly, it is desirable to provide an improved analog NV system that can detect the NV image without adversely affecting the NV image provided to the user (e.g., without attenuating the NV image provided to the user).

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes an optical device that includes a stacked device formed in a single semiconductor chip. The stacked device includes electro-optical circuits (e.g., OLED light emitters) formed on the semiconductor chip. Additionally, one or more transmission regions are arranged among the electro-optical circuits, and the transmission regions are at least partially transparent to light within a first range of wavelengths (e.g., visible light). The stacked device further includes one or more detectors in a pathway of those rays of light directed through the one or more transmission regions. The one or more detectors detect light within a second range of wavelengths (e.g., UV light) and transmit the light within the first range of wavelengths.

Another embodiment illustrated herein is an optical device that includes a phosphor screen. In response to incident radiant energy, the phosphor screen emits luminescent light representing an intensified image, and the luminescent light includes light within a first range of wavelengths (e.g., visible light) and light within a second range of wavelengths (e.g., UV light). The optical device further includes a detector that detects the light within the second range of wavelengths and transmits the light within the first range of wavelengths. Additionally, the optical device that includes a display that has emitters, and the emitters have one or more transmission regions arranged among respective them. The one or more transmission regions transmit the luminescent light within a first range of wavelengths, and the emitters emit display light.

A third embodiment illustrated herein is a method of intensifying an image that is provided to a user while also detecting the image. The method includes receiving luminescent light from a phosphor screen. The luminescent light represents an intensified image, and the luminescent light including light within a first range of wavelengths (e.g., visible light) and light within a second range of wavelengths (e.g., UV light). The luminescent light is received by one or more detectors. The method further includes detecting the intensified image using the one or more detectors. The one or more detectors detect the luminescent light within the second range of wavelengths and transmit the luminescent light within the first range of wavelengths. The method further includes transmitting the luminescent light within the first range of wavelengths through the one or more detectors. The method further includes emitting display light from a transparent display. The transparent display includes emitters with one or more transmission regions arranged among the emitters. The one or more transmission regions transmit the luminescent light within a first range of wavelengths.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

As discussed above, detecting the night vision (NV) image from analog NV system degrades the NV image provided to the user because the amplitude of the NV image is decreased by some of the light being absorbed by the photodetector to generate a detected NV image. That is, detecting the NV image decreases the amount of light in the NV image that is provided to the user. To mitigate this drawback, the inventors developed an analog NV system in which the non-visible light is detected from the NV image, and the visible portion of the NV image is not degraded.

For example, in the analog NV system, the phosphor in the image intensifier generates photons both out of the visible spectrum and in the visible spectrum. A photodetector then detects the photons out of the visible spectrum, but, in the visible spectrum, the photodetector is transmissive, transmitting the photons in the visible spectrum. Because the user can see only the photons in the visible spectrum, the visible NV image is not adversely affected by the photodetector detecting and consequently attenuating that portion of the light that is not visible to the user.

For example, in one implementation, the photons out of the visible spectrum emitted by the phosphor are ultraviolet (UV) photons/light (e.g., light having a wavelength range between 300 nm and 400 nm), and the photodetector detects the UV light by absorbing the UV light more strongly than light in the visible spectrum. In certain embodiments, the photodetector detecting UV light is integrated in a stacked microelectronic device that includes a transparent display, which provides heads-up display functionality by superimposing display light with the NV image, as discussed below.

In one embodiment, the analog NV system implements heads-up display functionality using a transparent display, which in some embodiments may be an organic light emitting diode (OLED) display in conjunction with an image output from an image intensifier. The OLED can be at least partially transparent to transmit the NV image generated by an image intensifier. Partially transparent means that the given component transmits 20% or more of the light incident on the component. Unless explicitly specified otherwise, the word "transparent" as used herein means partially transparent because in practice optical components are not 100% transparent due to Fresnel reflection, absorption, and scattering, for example. Additionally, the word "transmit" as used herein means that the given component allows 20% or more of the light incident on a component to pass through the component.

Transparent regions may be arranged between/among the pixels of the transparent display to transmit the intensified light conveying the NV image. The photodetector, which detects the light outside of the visible spectrum of the NV image, may be positioned to intercept the rays of intensified light passing through the transparent regions of the transparent display. The photodetector may be located upstream from the transparent display (e.g., before the light passes through the transparent regions of the transparent display) or downstream from the transparent display (e.g., after the light passes through the transparent regions of the transparent display). Alternatively, the photodetector may be located in the transparent regions of the transparent display. After passing through both the transparent display and the photodetector, the NV image is transmitted to the user.

Figure 1A:
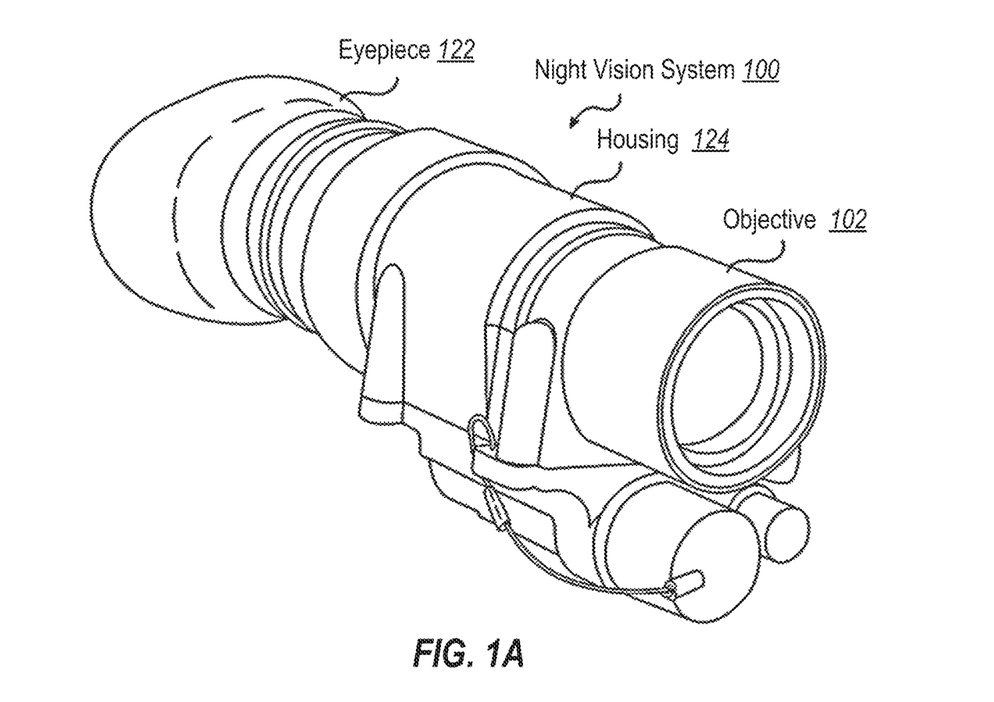
FIG. 1A illustrates a perspective view of a night vision (NV) system, according to one embodiment.
Figure 1B:
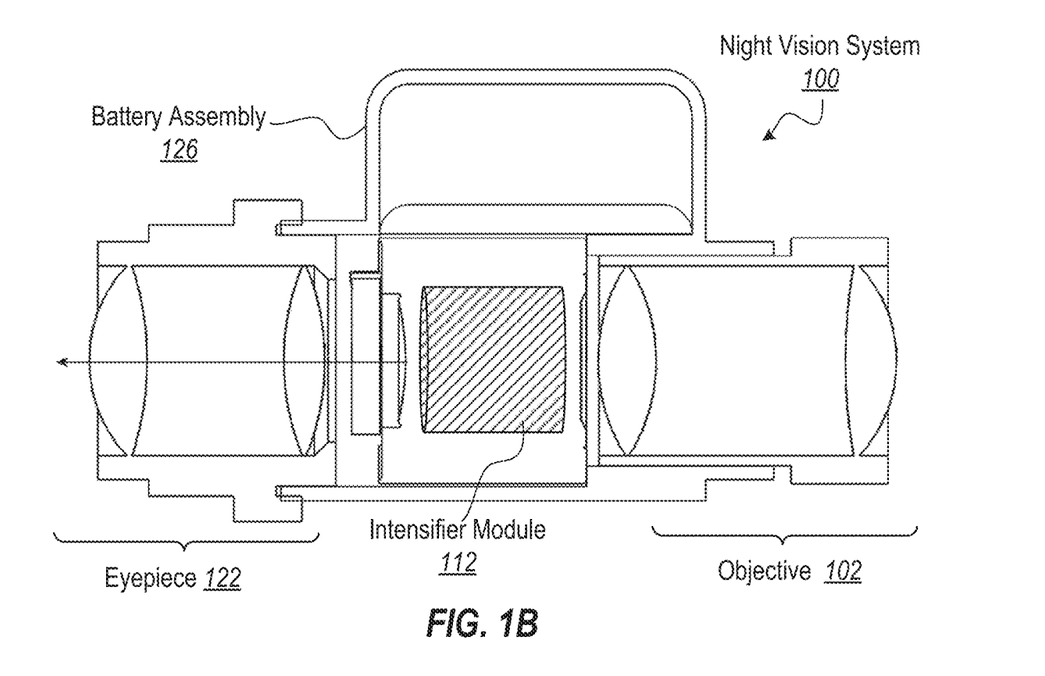
FIG. 1B illustrates a side cutaway view of the NV system, according to one embodiment.
Figure 1C:
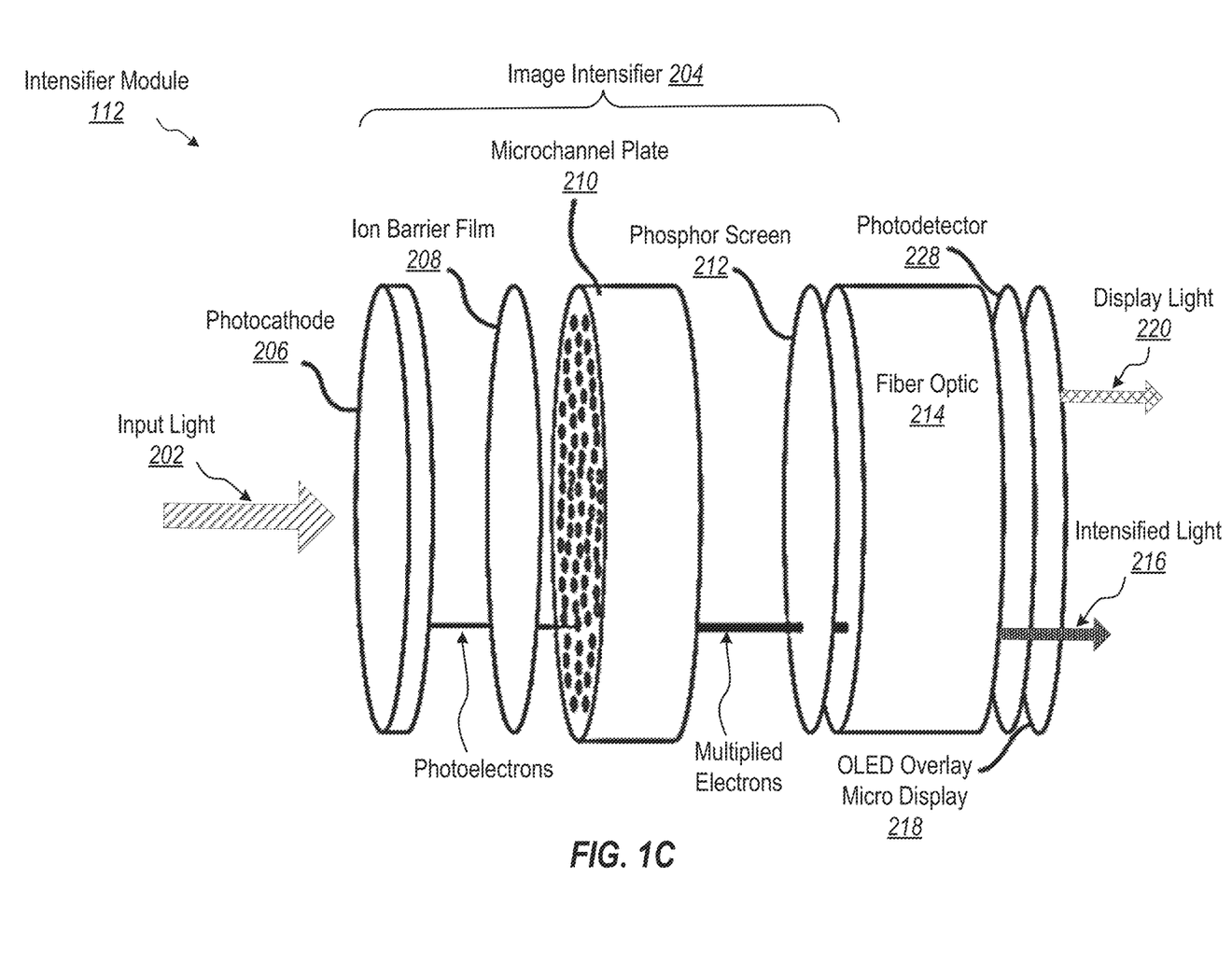
FIG. 1C illustrates a schematic diagram of an intensifier module of the NV system, according to one embodiment.

Referring now to FIGS. 1A-1C, a non-limiting example of a NV system is illustrated. In particular, FIGS. 1A and 1B illustrate a PVS-14 NV system 100. In the example illustrated, the NV system 100 includes a housing 124. As will be illustrated in more detail below in other figures, the housing 124 houses an image intensifier module 112, which includes an image intensifier 204, a photodetector 228, and various other components, as discussed below with reference to FIG. 1C. The NV system 100 further includes an objective 102 which receives light reflected and/or generated in an environment. The objective 102 includes optics such as lenses, waveguides, and/or other optical components for receiving and transmitting light to the image intensifier module 112. The NV system 100 further includes an eyepiece 122. The eyepiece 122 includes optics for focusing images created by the NV system 100 into the eye of the user. The image directed to the user includes images created by an image intensifier module 112 including the images generated by the image intensifier 204 and the transparent display 218.

FIG. 1C illustrates a block diagram of the image intensifier module 112, according to one embodiment. As discussed above, the input light 202 is transmitted through the objective 102 to the image intensifier module 112. The input light 202 may be, for example, weak light that would be challenging to see unaided with the naked eye, such as at nighttime when viewing a nightscape.

The objective directs the input light 202 into the image intensifier 204, as shown in FIG. 1C. The image intensifier 204 may include functionality for amplifying the received image so that the image that can be viewed by the user. In the illustrated embodiment, this amplification is accomplished using a photocathode 206, a microchannel plate 210, and a phosphor screen 212. The photocathode 206 absorbs incident photons and outputs electrons in response. The electrons may pass through an optional ion barrier film 208. Electrons from the photocathode 206 are transmitted to the microchannel plate 210, which multiplies the number of electrons. The multiplied electrons then strike a phosphor screen 212, which absorbs the energy from electrons generating photons in response. The phosphor screen 212 converts the radiant energy of the multiplied electrons to luminescent light via the phenomenon of luminescence. Accordingly, the phosphor screen 212 glows due to electrons from the microchannel plate 210 striking the phosphor screen 212, creating an intensified image that represents the image of the input light 202.

As discussed below, the spectrum of the photons emitted and the perceived color generated by the phosphor screen 212 depends on the chemical composition of the phosphor. For example, the phosphor P14 (ZnS:Ag on ZnS:CdS:Cu) is perceived to have a blue color with orange persistence. Additionally, the phosphor P15 (ZnO:Zn), P16 (CaMgSi$_2$O$_6$:Ce), and P17 (ZnO,ZnCdS:Cu) are respectively perceived to be blue with a green persistence, bluish-purple with a bluish-purple persistence, and blue with a yellow persistence. Phosphors can be developed to have emission peaks within desired wavelength ranges, such as within the UV wavelength range (e.g., 100 nm to 400 nm). For example, the phosphors L33 (BaSi$_2$O$_5$:Pb) and FL370 (SrB$_4$O$_7$(F):Eu) have emission peaks in the UV at 351 nm and 370 nm, respectively.

Returning to FIG. 1C, a fiber-optic element 214 carries the intensified light 216 (with the intensified image) to the eyepiece 122 of the NV system where it is output to the user. Before the eyepiece 122, the intensified light 216 is transmitted through a photodetector 228 and a transparent display 218. The transparent display 218 generates display light 220, which is superimposed with the intensified light 216. For example, the transparent display 218 may superimpose text or other symbols on an image from the intensified light 216.

The photodetector 228 absorbs a portion of the intensified light 216 converting it to an electrical signal. For example, the photodetector 228 can be a two-dimensional array of photodiodes that generates a charge (or current) proportional to intensity of the intensified light 216 as a function of position. Accordingly, the photodetector 228 may generate a two-dimensional array of electrical charge that represents the intensified image. In some embodiments, this two-dimensional array of electrical charge can be periodically read from the photodetector 228 (e.g., the detected signal can be read from the photodetector like in a charged coupled device (CCD) camera). In some embodiments, the two-dimensional array of electrical signals from the photodetector 228 is processed and/or used locally, e.g., within the transparent display 218 to modulate in real time the amplitude of the display light 220.

Figure 2:
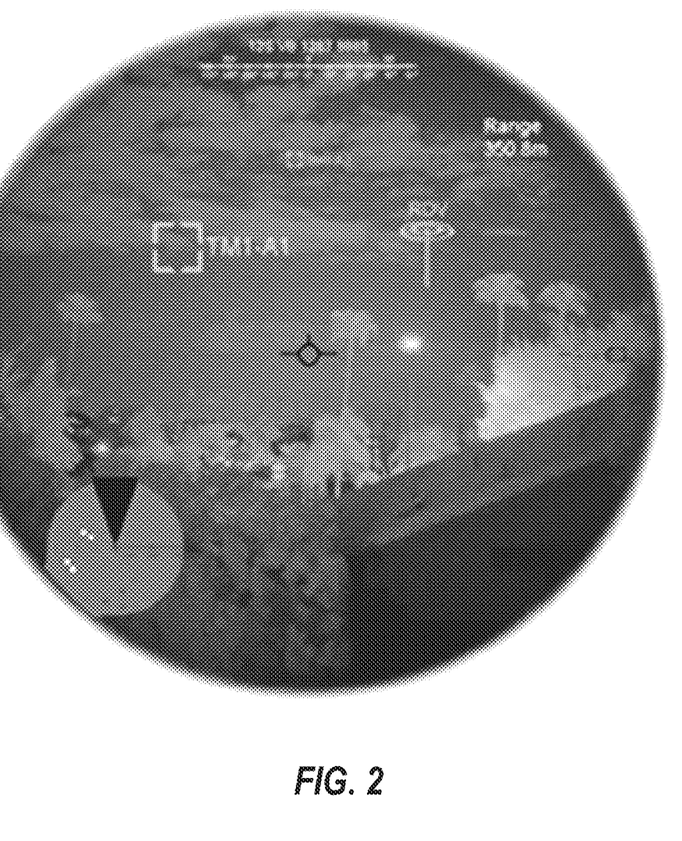
FIG. 2 illustrates a heads-up display displayed on an NV image, according to one embodiment.

As discussed above, the transparent display 218 may include functionality for displaying information to a user. Such information may include graphical content, including text, images, superimposed thermal image data and the like. FIG. 2 illustrates an example of an image in which a transparent display 218 superimposed text, symbols, and other information over an intensified image that includes trees and clouds.

The transparent display 218 outputs display light 220 which can be sent to the eyepiece (such as the eyepiece 122 illustrated in FIG. 1A). As noted previously, the intensified light 216 is also provided to the eyepiece. Thus, an image such as that illustrated in FIG. 2 is presented to the user in the NV system. Additional details regarding certain embodiments of the NV system 100 and the transparent display 218 are provided in U.S. patent application Ser. No. 16/868,306, filed on May 6, 2020, titled "Backside Etch Process For Transparent Silicon Oxide Technology", which is incorporated herein by reference in its entirety.

Figure 3A:
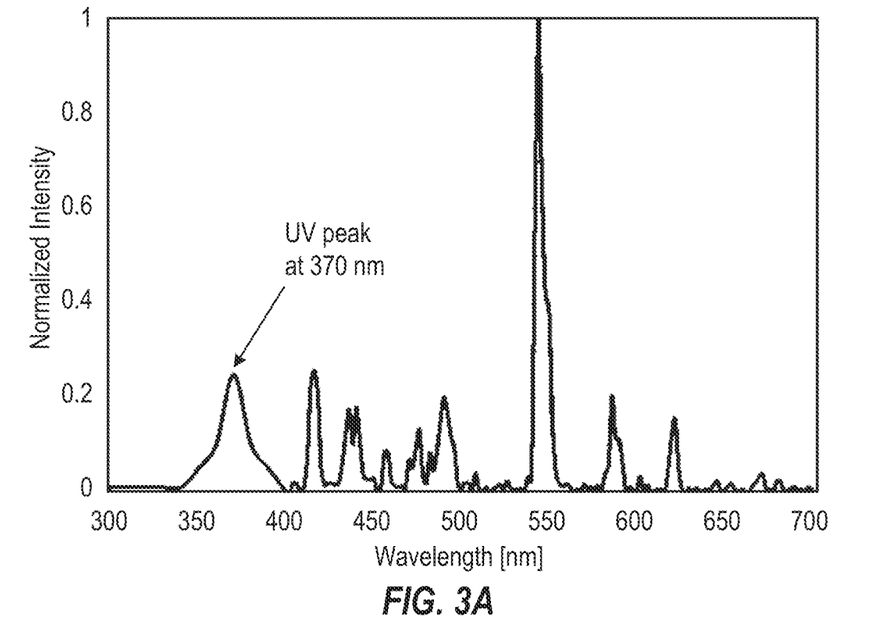
FIG. 3A illustrates a spectrum of luminescent light emitted from a phosphor, according to one embodiment.
Figure 3B:
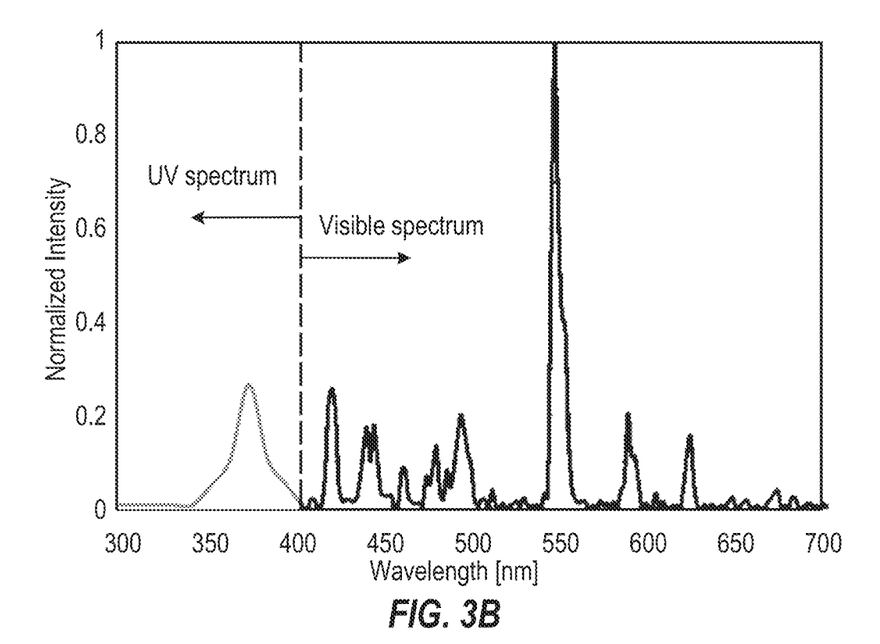
FIG. 3B illustrates the spectrum in FIG. 3A divided into an ultraviolet (UV) portion and a visible portion.
Figure 3C:
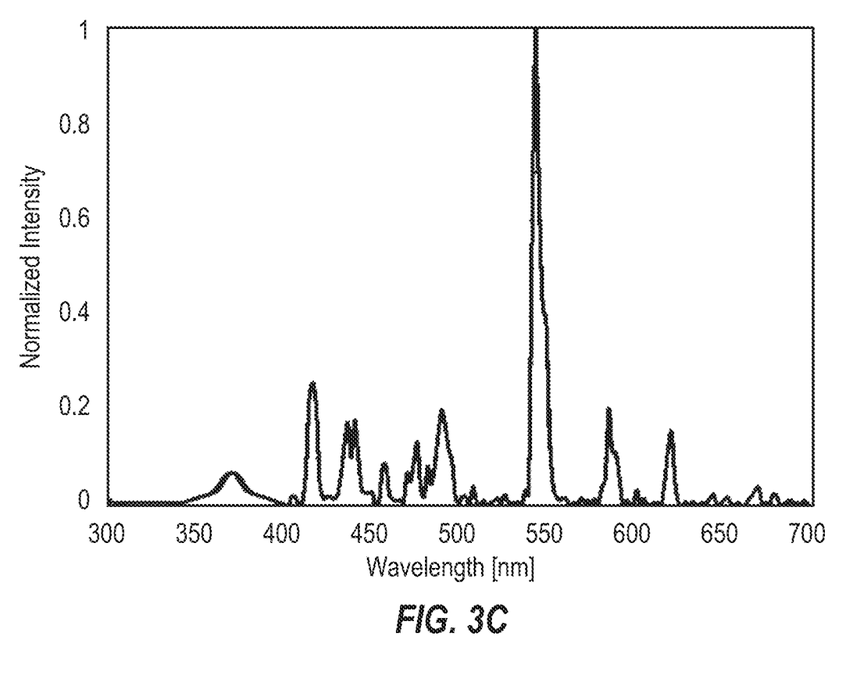
FIG. 3C illustrates a spectrum of the luminescent light after the UV portion has been attenuated by propagating through a photodetector of the intensifier module, according to one embodiment.

FIGS. 3A-3C illustrate examples of a spectrum of the intensified light 216 at various points within the NV system 100. Due to absorption varying as a function of the photon frequency/wavelength, the spectrum may be different before and after the various components of the NV system 100. For example, a person of ordinary skill in the art will recognize that the glass used in many types of lenses (e.g., borosilicate glass) have strong absorption of UV light (e.g., light having wavelengths in the range 100 nm to 400 nm). Further, UV light is outside of the visible spectrum (e.g., humans cannot see UV light). In view of this, the inventors recognized that UV light generated by the phosphor can be advantageously detected by a photodetector 228 located between the phosphor screen 212 and the eye piece 122 without adversely affecting the intensified image available to the user because the photodetector 228 only removes from the amplified light a portion of the spectrum that is not seen by the user. FIG. 3B shows 400 nm as the wavelength demarking the boundary between UV and visible light. In other embodiments, the boundary between UV and visible light may be 390 nm or 395 nm, for example. Infrared (IR) light is also not visible to users and can be detected by the photodetector 228 without degrading the NV image observed by the user. Detecting UV light by the photodetector 228 is preferred because it is more straightforward to make UV photodetectors semitransparent to visible light.

FIG. 3A illustrates a spectrum of the intensified light 216 immediately after the phosphor screen 212. This spectrum has a spectral peak in the UV at 370 nm. FIG. 3B illustrates this spectrum divided by a dashed line into a UV portion and a visible portion. The UV portion of the spectrum is illustrated as a grey line, and the visible portion of the spectrum is illustrated as a black line. When passing through the photodetector 228, the UV portion of the spectrum is preferentially/predominantly absorbed to generate an electrical signal and the visible portion is transmitted (i.e., a higher percentage of the visible portion is transmitted than the UV portion). For example, the photodetector 228 may be a two-dimensional (2D) array of photodiodes that excite photoelectrons into the conduction band of a semiconductor when a photon is absorbed.

In certain embodiments, a wide bandgap semiconductor may be used for the 2D array of photodiodes that preferentially absorb UV photons. For example, the wide bandgap semiconductor may be zinc selenide (ZnSe) having a bandgap of 2.8 eV corresponding to a wavelength of about 440 nm. Additionally or alternatively, the wide bandgap semiconductor may be cadmium sulfide (CaS), which has a bandgap of 2.6 eV corresponding to a wavelength of about 480 nm; gallium phosphide (GaP), which has a bandgap of 2.3 eV corresponding to a wavelength of about 540 nm; silicon carbide (SiC), which has a bandgap of 3.0 eV corresponding to a wavelength of about 410 nm; gallium arsenide (GaAs), which has a bandgap of 1.4 eV corresponding to a wavelength of about 860 nm; or tungsten oxide (WO$_3$), which has a bandgap of 2.8 eV corresponding to a wavelength of about 440 nm. A person of ordinary skill in the art will recognize that other wide bandgap semiconductors may also be used.

Alternatively, a non-wide bandgap semiconductor may be used for the photodetector 228. For example, the non-wide bandgap semiconductor, such as silicon, may be sufficiently thin that it transmits the visible portion of the spectrum while absorbing the UV portion of the spectrum. Silicon, for example, has an absorption coefficient that is about 100 times larger at 370 nm than at 550 nm. Accordingly, a thickness of silicon that absorbs 90% of the light at the wavelength 370 nm will only absorb 2% of the light at the wavelength 550 nm.

In certain embodiments, the photodetector 228 can use a non-semiconductor, such as organic molecules that are used in organic light emitting diodes (OLED). For example, the photodetector 228 may be a 2D array of OLEDs. As discussed below, the photodetector 228 may be fabricated in a different fabrication layer or in the same fabrication layer as the emitters of the transparent display 218. For example, the emitters of the transparent display 218 may be fabricated in an OLED stack 454. When the photodetector 228 are OLEDs configured to operate in a detector mode, rather than operate in an emitter mode, the photodetector 228 may be configured in the same OLED stack 454 as the emitters of the transparent display 218. Alternatively or additionally, the photodetector 228 may be configured in a different fabrication than the OLED stack 454 in which are configured the emitters of the transparent display 218.

FIG. 3C illustrates a spectrum of the intensified light 216 after it has passed through the photodetector 228. In this illustrative example, the spectral peak at 370 nm is attenuated 5 times more than the spectral peak at 550 nm. In some embodiments, the attenuation of the UV spectrum relative to the visible spectrum may be greater than 5, and, in other embodiments, the attenuation of the UV spectrum relative to the visible spectrum may be less than 5.

Figure 4A:
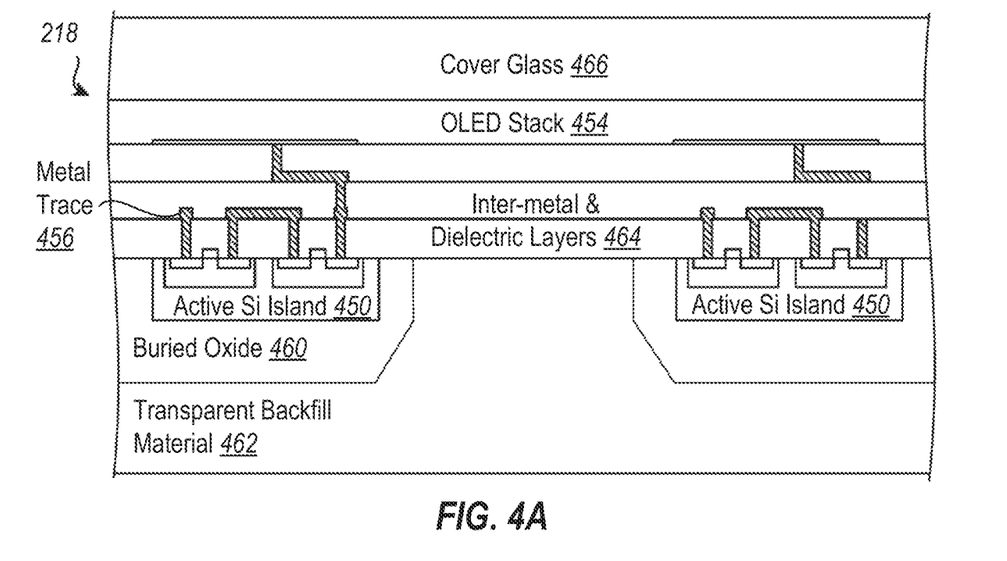
FIG. 4A illustrates a diagram of a portion of a transparent display, according to one embodiment.
Figure 4B:
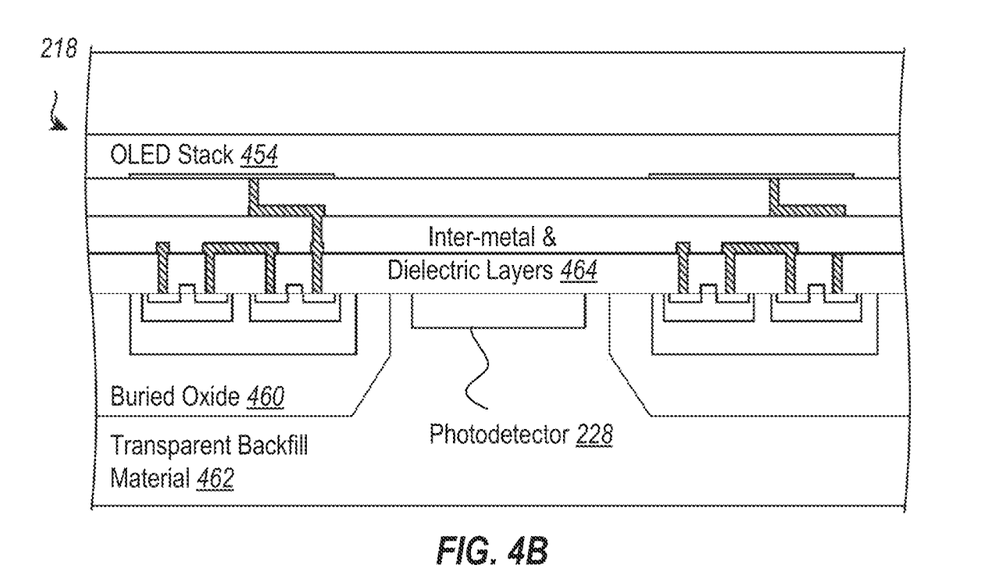
FIG. 4B illustrates a diagram of a portion of a transparent display with a photodetector located at a first location, according to one embodiment.
Figure 4C:
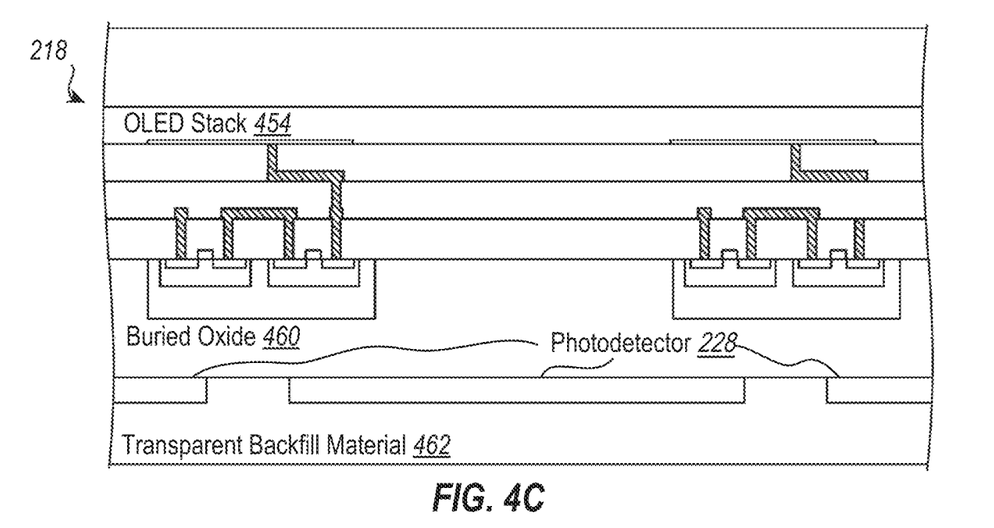
FIG. 4C illustrates a diagram of a portion of a transparent display with a photodetector located at a second location, according to one embodiment.
Figure 4D:
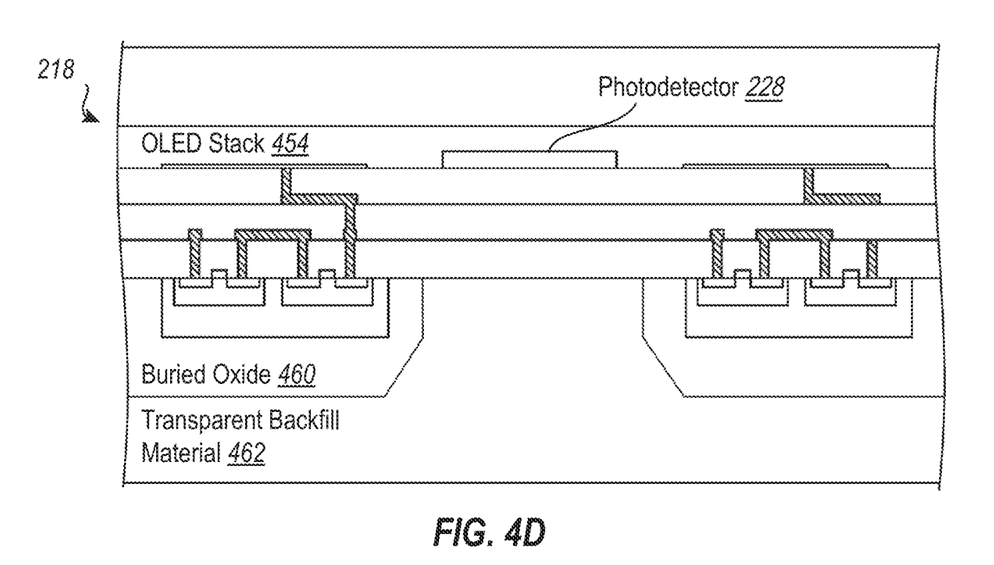
FIG. 4D illustrates a diagram of a portion of a transparent display with a photodetector located at a third location, according to one embodiment.

Referring now to FIGS. 4A-4E, in certain embodiments, the transparent display 218 is composed of a number of active silicon areas. For example, the transparent display 218 may be a digital display having a certain pixel density. Each pixel has one or more transistors controlling one or more OLEDs. Additional details regarding the transparent display 218 are provided in U.S. patent application Ser. No. 16/868,306. FIG. 4A illustrates the transparent display 218 in a non-limiting embodiment without the photodetector 228 being integrated. FIGS. 4B-4D illustrate the transparent display 218 for illustrative, non-limiting embodiments with an integrated photodetector 228.

In FIG. 4A, the photodetector 228 is not integrated with the transparent display 218. For example, the photodetector 228 may be located between a fiber optic 214 and the transparent display 218, as illustrated in the non-limiting embodiment in FIG. 1C. Alternatively, in certain embodiments, the photodetector 228 may be located between the phosphor screen 212 and the fiber optic 214. This embodiment has the advantage that the photodetector 228 detects the non-visible portion of the spectrum before it is attenuated by propagating through the fiber optic 214. For example, due to Rayleigh scattering, optical fibers tend to preferential attenuate UV light. In certain embodiments, the intensifier module 112 does not include the fiber optic 214, which is optional. Accordingly, in certain embodiments, the photodetector 228 may be located between the phosphor screen 212 and the transparent display 218.

Referring now to FIG. 4A, in certain non-limiting embodiments, the transparent display 218 may include active silicon areas, which are illustrated as active silicon islands 450 (e.g., native silicon islands). The active silicon islands 450 can be used to fabricate transistors, such as MOSFETs by doping the silicon (Si) with spatially varying concentrations donor and acceptor atoms. Further, the MOSFETs may be fabricated using intermetal and dielectric layers 464 that include insulators (e.g., oxides and dielectrics) and metal traces 456. In certain embodiments, the MOSFETs may provide (but are not limited to providing) logic functions and/or control functions (e.g., to control turning on/off the LEDs in the OLED stack 454).

In the example illustrated in FIG. 4A, each of the active silicon islands represents a pixel of the transparent display 218. Thus, by powering various LEDs in the OLED stack 454 using the transistors in the active silicon islands, a display image can be created by the transparent display 218 and output to a user. For example, a display image may be created by outputting the display light 220, as illustrated in FIG. 1C. In FIG. 4A, the intensified light 216 enters the transparent display 218 from the bottom, passes through the transparent backfill material 462 and then through the other layers before exiting the transparent display 218 through the cover glass 466. The display light 220 is generated in the OLED and, like the intensified light 216 exits through the cover glass 466. After exiting through the cover glass, both the display light 220 and the intensified light 216 are transmitted to the eyepiece 122 of the NV system 100, and then to the user.

The intensified light 216 is transmitted between the pixels of the transparent display 218 because the active Si islands 450 and the metal traces 456 substantially block the intensified light 216. The embodiment illustrated in FIG. 4A uses a backside etch process to remove the silicon in regions between the pixels of the transparent display 218, and then a transparent backfill material 462 is used to backfill the regions in which the silicon was removed via the etch.

In other non-limiting embodiments (not illustrated), the regions between the pixels of the transparent display 218 are made to be partial transmitting by fabricating oxide trenches in the silicon layer (e.g., by fabricating oxide trenches in non-active Si islands), as discussed in U.S. patent application Ser. No. 16/868,306. The oxide trenches attenuate the intensified light 216 much less than the native silicon, thereby enabling the intensified light 216 to be partially transmitted in the regions between the pixels of the transparent display 218.

A person of ordinary skill would understand that transmission of the intensified light 216 may be achieved using one (or more) of the following techniques: backside etch, fabricating oxide trenches, or another technique that improves the transmission of light through the regions between the pixels of the transparent display 218.

FIG. 4B illustrates an embodiment in which a photodetector 228 is fabricated below the inter-metal and dielectric layer 464. For example, the photodetector 228 may be a photodiode that has been fabricated using a thinned layer of silicon or other narrow-band gap semiconductor (e.g., germanium). Alternatively, the photodetector 228 may be another semiconductor, such as a wide bandgap semiconductor that has been fabricated using epitaxial growth or another microfabrication technique.

FIG. 4C illustrates an embodiment in which a photodetector 228 is fabricated in a layer below the layer in which the active Si island 450 is fabricated. This embodiment has the advantage that the photodetector 228 is not constrained to the regions between the pixels of the transparent display 218. Increasing the area of the photodetector 228 can increase the signal detected by the photodetector 228 because more photons are captured in the larger area.

As discussed above, the intensified light 216 is substantially blocked by the active Si island 450 and the metal traces 456. Accordingly, absorbing part (or all) of the rays of the intensified light 216 that are incident on the pixels of the transparent display 218 does not degrade the intensified image seen by the user because the rays of the intensified light 216 that are incident on the pixels of the transparent display 218 are substantially blocked and are therefore not included in the intensified image seen by the user. Thus, the embodiment illustrated in FIG. 4C has the advantage of increasing the detected signal without degrading the intensified image seen by the user. There may be other tradeoffs, however, to increasing the area of the photodetector 228. For example, increasing the area of the photodetector 228 may increase its capacitance, resulting in a slower response time because the RC time constant increases with the increased capacitance.

FIG. 4D illustrates an embodiment in which a photodetector 228 is fabricated in the layer of the OLED stack 454. For example, the photodetector 228 may be an LED that is operated as a light detector (e.g., as a photodiode) rather than as a light source.

As discussed above, in the embodiments of the photodetector 228 illustrated in FIGS. 4B-4D, the photodetector 228 is illustrated as being integrated with a transparent display 218 fabricated using a backside etch, but a person of ordinary skill would recognize that these embodiments of the photodetector 228 may be integrated with transparent displays fabricated using other techniques than a backside etch.

Figure 5:
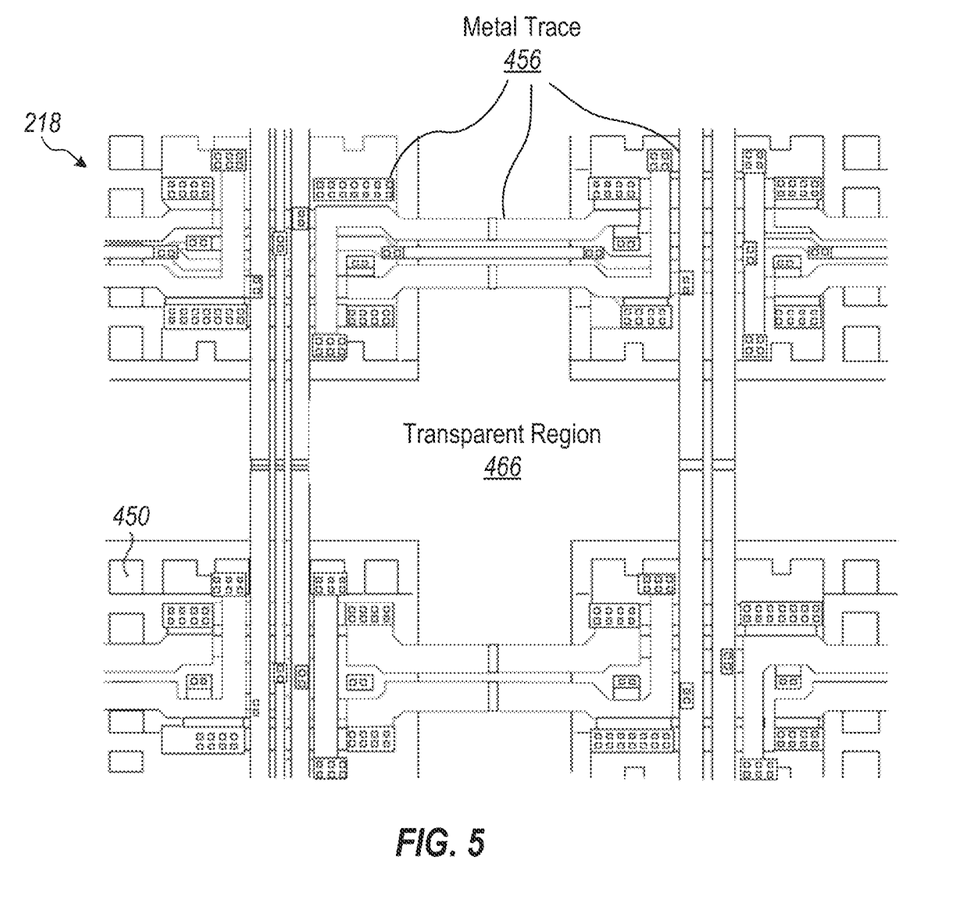
FIG. 5 illustrates a diagram of metal traces of a portion of the transparent display, according to one embodiment.

FIG. 5 illustrates an example of a portion of a transparent display 218 where active Si islands 450 and metal traces 456 are configured as electronic components (such as MOSFETs) to provide logic functions and to provide control functions for the control of pixels in a transparent display 218. The active Si islands 450 and metal traces 456 substantially block the intensified light 216, but the intensified light 216 may be transmitted through the transparent region 466 between the Si islands 450 and metal traces 456.

Figure 6A:
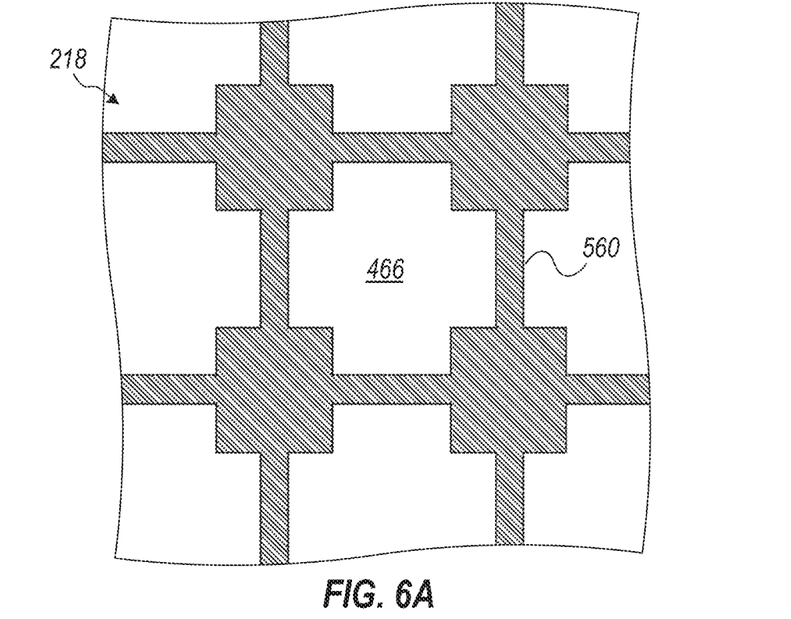
FIG. 6A illustrates a diagram of opaque regions and transparent regions of a portion of the transparent display, according to one embodiment.

FIG. 6A illustrates portion of a transparent display 218 in which the opaque regions 560, which include the active Si islands 450 and metal traces 456, are indicated using a downward diagonal line texture. Rays of the intensified light 216 that pass through the opaque region 560 are substantially blocked due to attenuation by the active Si islands 450 and metal traces 456. Rays of the intensified light 216 that pass through the transparent region 466 (e.g., outside the opaque region 560) may be transmitted through the transparent display 218 because these rays are not substantially blocked.

Figure 6B:
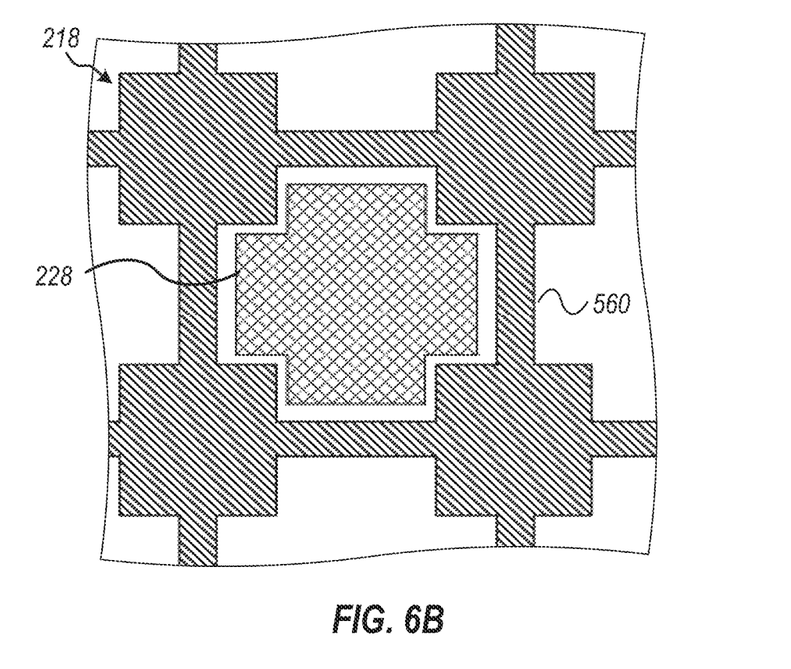
FIG. 6B illustrates a diagram of photodetector having a first configuration with respect to the opaque regions of the transparent display, according to one embodiment.

FIG. 6B illustrates portion of a transparent display 218 in which the photodetector 228 is arranged within the transparent region 466 lying between the opaque region 560, and the photodetector 228 is spaced from the opaque region 560. This configuration of the photodetector 228 may be used, e.g., when the photodetector 228 is in a same layer as the active Si islands 450, as illustrated in FIG. 4B. Additionally or alternatively, this configuration of the photodetector 228 may be used, e.g., when the photodetector 228 is in the layer of the OLED stack 454, as illustrated in FIG. 4D. This configuration of the photodetector 228 may also be used in other embodiments, including but not limited to where: (i) the photodetector 228 is provided in another silicon layer than the silicon layer of the active Si islands 450, as illustrated in FIG. 4C; (ii) the photodetector 228 is located between the phosphor screen 212 and the fiber optic 214; and (iii) the photodetector 228 is located between a fiber optic 214 and the transparent display 218.

Figure 6C:
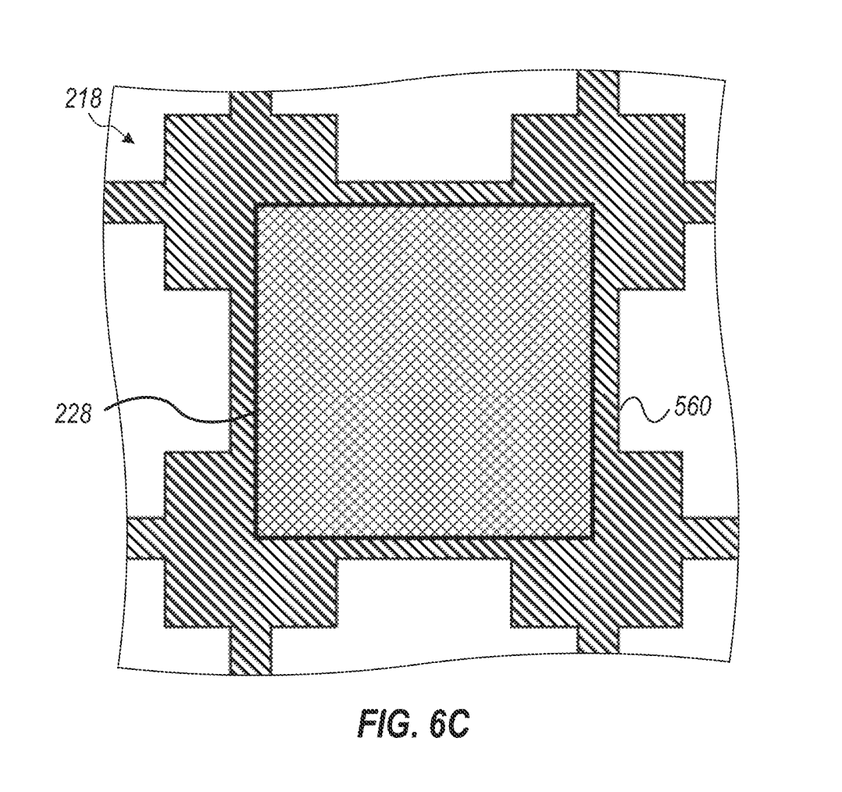
FIG. 6C illustrates a diagram of photodetector having a second configuration with respect to the opaque regions of the transparent display, according to one embodiment.

FIG. 6C illustrates a portion of a transparent display 218 in which the photodetector 228 is both in the transparent region 466 and overlaps parts of the opaque region 560. This configuration of the photodetector 228 may be used, e.g., when the photodetector 228 is in another layer than the active Si islands 450, as illustrated in FIG. 4C. This configuration of the photodetector 228 may also be used in other embodiments, including but not limited to where: (i) the photodetector 228 is located between the phosphor screen 212 and the fiber optic 214 and (ii) the photodetector 228 is located between a fiber optic 214 and the transparent display 218.

In the examples above it should be noted that although not shown various alternatives can be implemented. For example, in any of the embodiments illustrated, a backside fill may be used or may be omitted. Alternatively, or additionally, while the active areas have been shown as being substantially square in nature, it should be appreciated that the active areas may be rectangular or other appropriate shapes.

The discussion above refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical device comprising:
   a stacked device formed in a single semiconductor chip, the stacked device comprising:
   a plurality of electro-optical circuits formed on the semiconductor chip, and one or more transmission regions being arranged among respective electro-optical circuits of the plurality of electro-optical circuits, the transmission regions being at least partially transparent to light within a first range of wavelengths; and
   one or more detectors configured to be in a pathway of rays of light directed through the one or more transmission regions, the one or more detectors detecting light within a second range of wavelengths and transmitting the light within the first range of wavelengths.

2. The optical device of claim 1, wherein the plurality of electro-optical circuits comprises a plurality of light emitters.

3. The optical device of claim 2, wherein the plurality of light emitters is driven by a plurality of transistors.

4. The optical device of claim 3, wherein the one or more detectors are in a same layer as the plurality of transistors.

5. The optical device of claim 1, wherein the plurality of electro-optical circuits comprises individual pixels of a display.

6. The optical device of claim 1, wherein the light within the second range of wavelength is ultraviolet light and the light within the second range of wavelengths is visible light.

7. The optical device of claim 1, wherein the one or more detectors are detectors selected from the group consisting of light emitting diodes, organic light emitting diodes, thinned silicon photodiodes, thinned narrow-bandgap photodiodes, or a large-bandgap photodiodes.

8. The optical device of claim 1, wherein the one or more detectors are arranged in regions between the plurality of electro-optical circuits and, when viewed from above a plane of the stacked device, the one or more detectors are spaced from the plurality of electro-optical circuits.

9. The optical device of claim 1, wherein, when viewed from above a plane of the stacked device, the one or more detectors overlap a part of the plurality of electro-optical circuits.

* * * * *